(12) United States Patent
Johansson et al.

(10) Patent No.: US 9,149,871 B2
(45) Date of Patent: Oct. 6, 2015

(54) ALUMINA LAYER WITH MULTITEXTURE COMPONENTS

(75) Inventors: Mats Johansson, Linkoping (SE); Tommy Larsson, Angelsberg (SE); Oscar Alm, Uppsala (SE); Jon Andersson, Vasteras (SE)

(73) Assignee: SECO TOOLS AB, Fagersta (SE)

( * ) Notice: Subject to any disclaimer, the term of this patent is extended or adjusted under 35 U.S.C. 154(b) by 134 days.

(21) Appl. No.: 13/882,229

(22) PCT Filed: Oct. 26, 2011

(86) PCT No.: PCT/EP2011/068737
§ 371 (c)(1),
(2), (4) Date: Apr. 29, 2013

(87) PCT Pub. No.: WO2012/055906
PCT Pub. Date: May 3, 2012

(65) Prior Publication Data
US 2013/0212953 A1  Aug. 22, 2013

(30) Foreign Application Priority Data
Oct. 29, 2010   (SE) .................................... 10189338

(51) Int. Cl.
| | | |
|---|---|---|
| *B24D 3/00* | (2006.01) | |
| *B23B 27/14* | (2006.01) | |
| *C23C 16/02* | (2006.01) | |
| *C23C 16/40* | (2006.01) | |
| *C23C 30/00* | (2006.01) | |
| *C23C 16/00* | (2006.01) | |

(52) U.S. Cl.
CPC ........... *B23B 27/148* (2013.01); *C23C 16/0272* (2013.01); *C23C 16/403* (2013.01); *C23C 30/005* (2013.01); *B23B 2224/04* (2013.01); *B23B 2228/105* (2013.01); *B23B 2270/54* (2013.01); *B23C 2270/00* (2013.01)

(58) Field of Classification Search
CPC ...... C23C 30/005; C23C 16/00; B23B 27/148
USPC ........... 427/255.23, 255.28, 255.31; 428/698, 428/701, 702; 51/307
See application file for complete search history.

(56) References Cited

U.S. PATENT DOCUMENTS

| | | |
|---|---|---|
| 3,836,392 A | 9/1974 | Lux et al. |
| 3,837,896 A | 9/1974 | Lindstrom et al. |
| 3,967,035 A | 6/1976 | Hale |
| 4,619,866 A | 10/1986 | Smith et al. |
| 5,162,147 A | 11/1992 | Ruppi |
| 5,654,035 A | 8/1997 | Ljungberg et al. |
| 5,700,569 A | 12/1997 | Ruppi |
| 5,702,808 A | 12/1997 | Ljungberg |
| 5,766,782 A | 6/1998 | Ljungberg |
| 5,968,595 A | 10/1999 | Kutscher |
| 5,980,988 A | 11/1999 | Ljungberg |
| 6,015,614 A | 1/2000 | Ruppi |
| 6,333,103 B1 | 12/2001 | Ishii et al. |
| 6,572,991 B1 | 6/2003 | Ruppi |
| 6,632,514 B1 | 10/2003 | Sulin et al. |
| 6,689,450 B2 | 2/2004 | Ruppi |
| 6,855,413 B2 | 2/2005 | Ljungberg |
| 7,011,867 B2 | 3/2006 | Martensson |
| 7,094,447 B2 | 8/2006 | Ruppi |
| 7,442,431 B2 | 10/2008 | Ruppi |
| 7,442,432 B2 | 10/2008 | Ruppi |
| 7,455,900 B2 | 11/2008 | Ruppi |
| 7,470,296 B2 | 12/2008 | Lindholm et al. |
| 7,993,742 B2 | 8/2011 | Ruppi |
| 2004/0028951 A1 | 2/2004 | Ruppi |
| 2007/0104945 A1 | 5/2007 | Ruppi |
| 2008/0187774 A1 | 8/2008 | Ruppi |
| 2013/0156517 A1 | 6/2013 | Larsson et al. |

FOREIGN PATENT DOCUMENTS

| | | |
|---|---|---|
| CN | 1107901 A | 9/1995 |
| CN | 1939715 A | 4/2007 |
| CN | 102933742 A | 2/2013 |
| EP | 0 659 903 | 6/1995 |
| EP | 1 528 125 | 5/2005 |
| EP | 1 655 392 | 5/2006 |
| EP | 2 014 789 | 1/2009 |

OTHER PUBLICATIONS

Translation of Chinese Office Action, dated Sep. 25, 2014, from corresponding CN application.
International Search Report dated Jul. 24, 2012, corresponding to PCT/EP2011/068737.

*Primary Examiner* — Pegah Parvini
(74) *Attorney, Agent, or Firm* — Young & Thompson

(57) ABSTRACT

A cutting tool insert for machining by chip removal includes a body of a hard alloy of cemented carbide, cermet, ceramics or cubic boron nitride based material onto which a hard and wear resistant coating is deposited by CVD. The coating includes at least one multitextured $\alpha\text{-Al}_2\text{O}_3$ layer with a thickness between 0.5 μm and 30 μm characterized with an ODF texture index>1 and at least two dominant texture components with 2<ODF density<100 coexisting within the layer. A method of making and using the cutting tool insert are also described.

26 Claims, 11 Drawing Sheets

ALUMINA LAYER WITH MULTITEXTURE COMPONENTS

BACKGROUND OF THE INVENTION

1. Field of the Invention

The present invention relates to a coated cutting tool comprising a body coated combining a multi textured alpha-alumina ($\alpha$-$Al_2O_3$) layer, the method of making and use the same. The layer is grown by chemical vapour deposition (CVD) and the invention provides an oxide layer with improved wear properties and good chip forming machining properties.

2. Description of the Related Art

Typically, CVD alumina based coatings comprise an inner layer of titanium carbonitride and an outer layer of $Al_2O_3$. The development and use comprise different $Al_2O_3$ polymorphs, e.g., $\alpha$-$Al_2O_3$, $\kappa$-$Al_2O_3$ and $\gamma$-$Al_2O_3$ as well as multilayer structures thereof.

U.S. Pat. No. 3,967,035 discloses an $\alpha$-$Al_2O_3$ coated cutting tool insert where the layer is bonded to the insert through a thin intermediate layer of an iron group metal aluminate.

U.S. Pat. No. 3,836,392 discloses an $\alpha$-$Al_2O_3$ coated cutting tool insert where the layer is deposited directly onto the insert.

U.S. Pat. No. 3,837,896 discloses an $\alpha$-$Al_2O_3$ coated cutting tool insert where an intermediate carbide or nitride layer is deposited prior to the oxide layer.

U.S. Pat. No. 4,619,866 discloses an $\alpha$-$Al_2O_3$ coated cutting tool insert where the oxide is deposited utilizing a dopant selected from the group consisting of sulphur, selenium, tellurium, phosphorous, arsenic, antimony, bismuth and mixtures thereof, dramatically increasing the growth rate of the layer.

U.S. Pat. No. 5,968,595 discloses a cutting tool insert coated with single- or multilayers, comprising at least one layer of a {210} textured $\kappa$-$Al_2O_3$.

U.S. Pat. No. 5,162,147 discloses a cutting tool insert coated with an inner $\alpha$-$Al_2O_3$ layer and an outer $\kappa$-$Al_2O_3$ layer.

U.S. Pat. No. 5,700,569 discloses a multilayer oxide coated cutting tool insert comprising layers of either $\alpha$-$Al_2O_3$ or $\kappa$-$Al_2O_3$.

U.S. Pat. No. 6,015,614 discloses a cutting tool insert coated with a multilayer structure of TiN/TiC on a thick layer of a single and/or bi-layer of $\alpha$-$Al_2O_3$ and $\kappa$-$Al_2O_3$.

U.S. Pat. No. 6,632,514 discloses a cutting tool insert coated with a multilayer of $\kappa$-$Al_2O_3$ and TiN or Ti(C,N) layers.

U.S. Pat. No. 7,470,296 discloses a cutting tool insert coated with a multilayer comprising layers of Ti(C,N) and $Al_2O_3$, preferably $\kappa$-$Al_2O_3$.

U.S. Pat. No. 6,855,413 discloses a cutting tool insert coated multilayer comprising layers of TiN and $\kappa$-$Al_2O_3$.

U.S. Pat. No. 6,572,991 discloses an oxide coated cutting tool insert with an outer layer a layer of $\gamma$-$Al_2O_3$.

U.S. Pat. No. 6,689,450 discloses a coated cutting tool insert having a multilayer of $\kappa$-$Al_2O_3$ and or $\gamma$-$Al_2O_3$ or TiN.

Further enhancement of the oxide layers has recently been achieved through the control of crystallographic orientation, texture, especially for the $\alpha$-$Al_2O_3$ polymorph. This has been achieved by the development of new synthesis routes comprising the use of nucleation and growth sequences, bonding layers, sequencing of the reactant gases, addition of texture modifying agents and/or by using alumina conversion layers. Commonly, the texture is evaluated by the use of X-ray diffraction (XRD) techniques and the concept of texture coefficients.

Textured Alumina Layer Synthesis Using Various Bonding/Nucleation Layers and Growth Sequences U.S. Pat. No. 7,094,447 discloses a method to produce textured $\alpha$-$Al_2O_3$ layers with improved wear resistance and toughness. The $\alpha$-$Al_2O_3$ layer is formed on a (Ti,Al)(C,O,N) bonding layer using a nucleation sequence composed of aluminizing and oxidization steps. The layer is characterized by a {012} growth texture as determined by XRD.

U.S. Pat. No. 7,442,431 discloses a method to produce textured $\alpha$-$Al_2O_3$ layers on a (Ti,Al)(C,O,N) bonding layer using a nucleation sequence composed of short pulses and purges of Ti-containing pulses and oxidizing pulses. The layer is characterized by a {110} growth texture as determined by XRD.

U.S. Pat. No. 7,455,900 discloses a method to produce textured $\alpha$-$Al_2O_3$ layers on a (Ti,Al)(C,O,N) bonding layer using a nucleation sequence composed of short pulses and purges consisting of Ti+Al pulses and oxidizing pulses. The layer is characterized by a {116} growth texture as determined by XRD.

U.S. Pat. No. 7,442,432 discloses a method to produce textured $\alpha$-$Al_2O_3$ layers on a (Ti,Al)(C,O,N) bonding layer with a modified but similar technique as disclosed in U.S. Pat. No. 7,455,900. The layer is characterized by a {104} growth texture as determined by XRD.

US 2007104945 discloses a textured $\alpha$-$Al_2O_3$ coated cutting tool insert for which a nucleation controlled $\alpha$-$Al_2O_3$ layer texture is obtained. The layer is characterized by a {006} growth texture as determined by XRD.

US 2008187774 discloses a texture-hardened $\alpha$-$Al_2O_3$ coated cutting tool insert with a {006} growth texture as determined by XRD.

U.S. Pat. No. 6,333,103 discloses a textured $\alpha$-$Al_2O_3$ layer grown on a Ti(C,O) bonding layer characterized by a {10(10)} growth texture as determined by XRD.

Textured Alumina Layer Synthesis Using Sequencing of Reactant Gases

U.S. Pat. No. 5,654,035 discloses a body coated with refractory single- or multilayers, wherein specific layers are characterized by a controlled microstructure and phase composition with crystal planes grown in a preferential direction with respect to the surface of the coated body (growth texture). The textured $\alpha$-$Al_2O_3$ layer is obtained by sequencing of the reactant gases in the following order: $CO_2$, CO and $AlCl_3$. The layer is characterized by a {012} growth texture as determined by XRD.

U.S. Pat. No. 5,766,782 discloses a cutting tool coated with refractory single- or multilayers including $\alpha$-$Al_2O_3$, wherein specific layers are characterized by a controlled growth texture with respect to the surface of the coated body. The textured $\alpha$-$Al_2O_3$ layer is obtained by sequencing of the reactant gases such that first $CO_2$ and CO are supplied to the reactor in an $N_2$ and/or Ar atmosphere followed by supplying $H_2$ and $AlCl_3$ to the reactor. The layer is characterized by a {104} growth texture as determined by XRD.

Textured Alumina Layer Synthesis Using Texture Modifying Agents

U.S. Pat. No. 7,011,867 discloses a coated cutting tool comprising one or more layers of refractory compounds out of which at least one layer is an $\alpha$-$Al_2O_3$ layer having a columnar grain-structure and a {300} growth texture as determined by XRD. The microstructure and texture is obtained by adding $ZrCl_4$ as a texture modifying agent to the reaction gas during growth.

U.S. Pat. No. 5,980,988 discloses a {110} textured α-Al$_2$O$_3$ layer as obtained by using SF$_6$ as a texture modifying agent during growth. The texture is determined by XRD.

U.S. Pat. No. 5,702,808 discloses a {110} textured α-Al$_2$O$_3$ layer as obtained sequencing SF$_6$ and H$_2$S during growth. The texture is determined by XRD.

Textured Alumina Layer Synthesis Using Conversion Layers

US RE41111 discloses a {0001} textured α-Al$_2$O$_3$ layer as obtained using an initial heat treated alumina core layer (conversion layer) with a thickness of 20-200 nm. The texture is determined by electron back scattering diffraction (EBSD).

An explanation of EBSD and the analysis for texture evaluation by using pole figures, pole plots, orientation distribution functions (ODFs) and texture indexes can for instance be found in *Introduction to Texture Analysis: Macrotexture, Microtexture, and Orientation Mapping*, Valerie Randle and Olaf Engler, (ISBN 90-5699-224-4) pp. 13-40.

SUMMARY OF THE INVENTION

Typically, the evaluation of texture may comprise
i) construction of the ODF,
ii) identifying the components Euler angles $\phi_1$, $\Phi$ and $\phi_2$ (cf. FIG. 5) and their corresponding ODF densities and crystallographic indices,
iii) construction of pole figure(s) of relevant texture components, and/or
iv) construction of pole plot(s) of the relevant texture components.

It is an object of the present invention to provide a multitexture controlled α-Al$_2$O$_3$ layer deposited by CVD with improved wear properties and chip forming cutting performance.

It is also an object of the present invention to provide a method of producing the same.

Surprisingly, it has been found that the control of a multitextured α-Al$_2$O$_3$ layer is obtained solely by the growth conditions resulting in tailorable α-Al$_2$O$_3$ layers with improved metal cutting properties.

BRIEF DESCRIPTION OF THE DRAWINGS

FIG. 7). MUD is the multiples of unit distribution.

DETAILED DESCRIPTION OF THE INVENTION

Figure 1A:
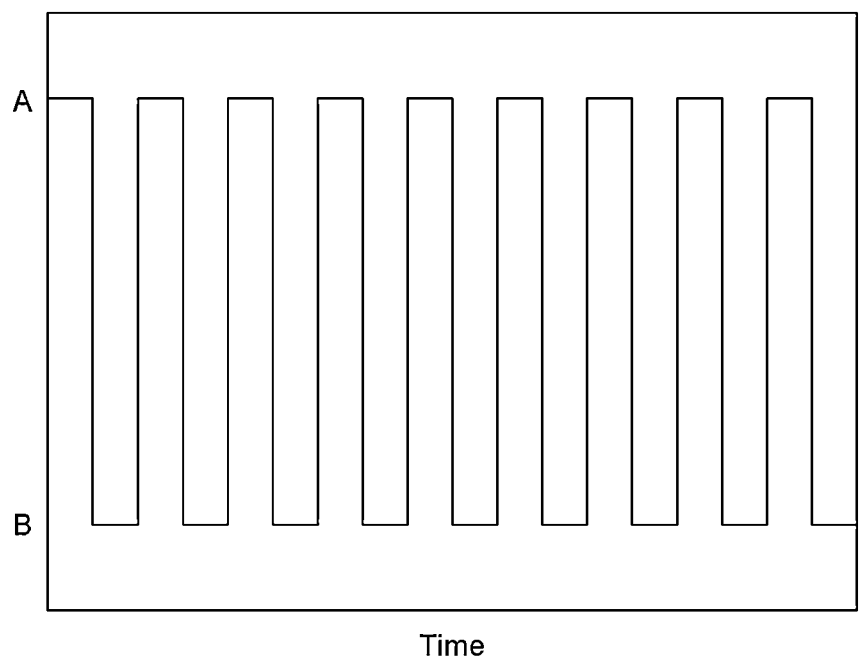
FIG. 1. Examples of the deposition of α-Al$_2$O$_3$ varying between the process conditions A, B, etc. periodically/aperiodically, upwards/downwards and/or continuously/stepwise.
Figure 1B:
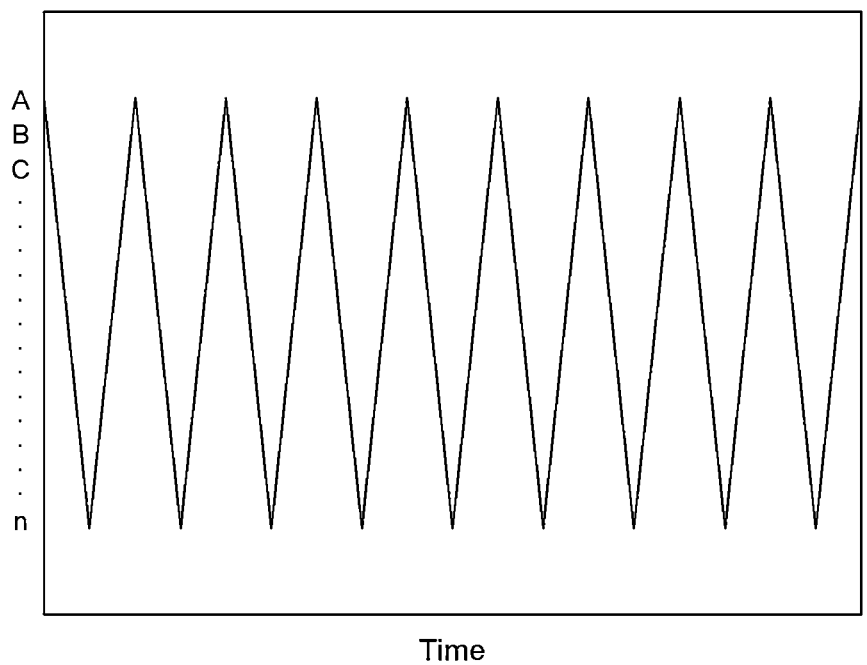
Figure 1C:
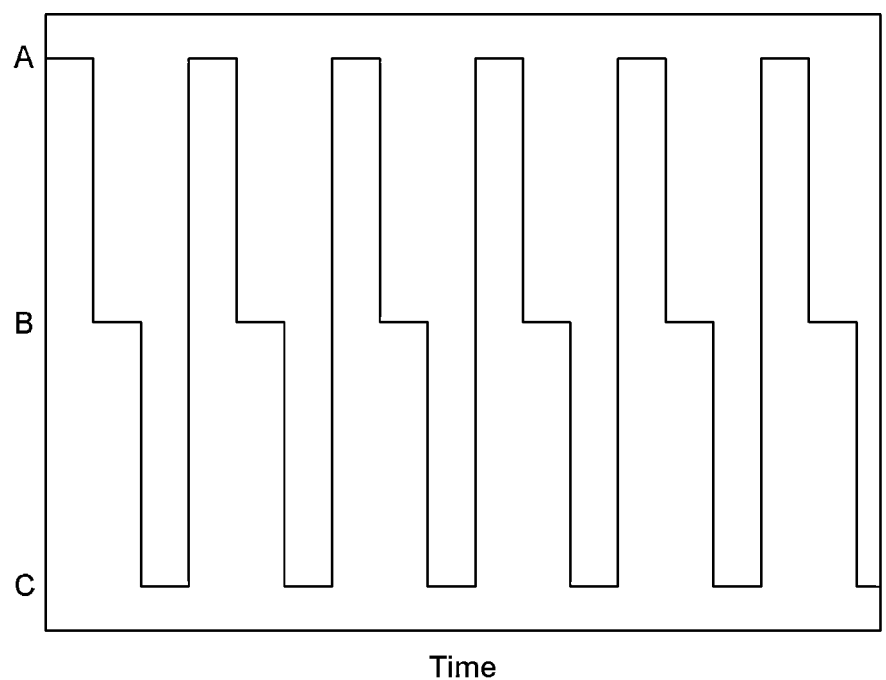
Figure 1D:
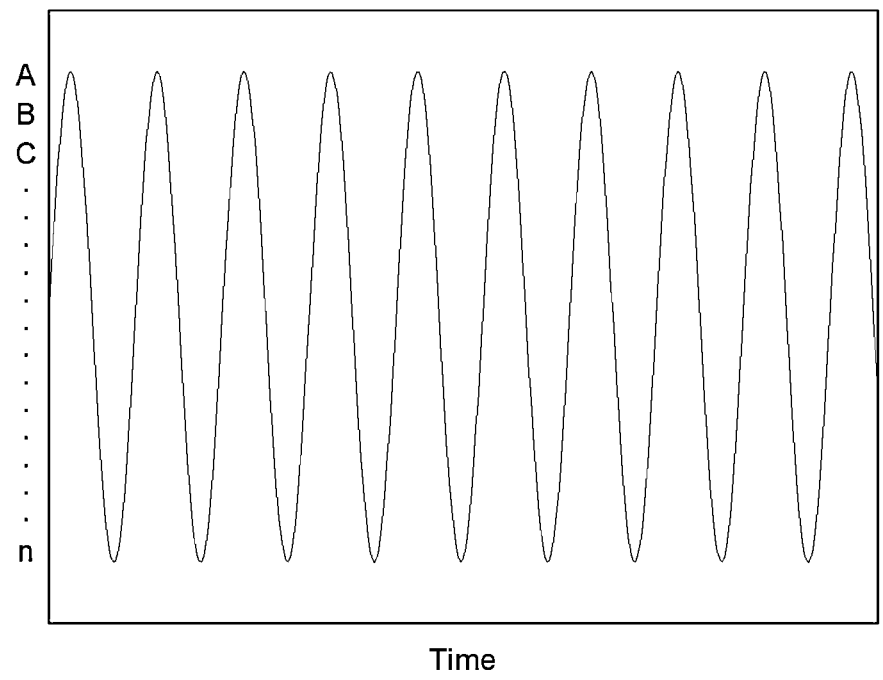
Figure 1E:
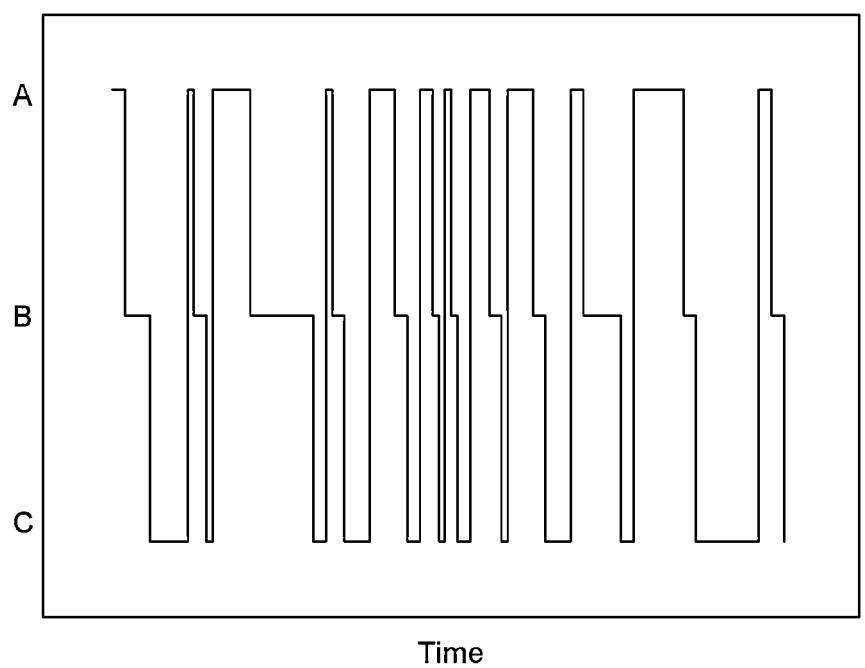

According to the present invention, there is provided a cutting tool insert for machining by chip removal comprising a body of a hard alloy of cemented carbide, cermet, ceramic, cubic boron nitride based material onto which a hard and wear resistant coating is deposited by CVD comprising at least one α-Al$_2$O$_3$ layer, herein defined as a multitextured α-Al$_2$O$_3$ layer, with
- an ODF texture index>1, preferably 1<ODF texture index<50, most preferably 1<ODF texture index<10, and
- at least two dominant texture components, i.e., the highest ODF densities, each of which having 2<ODF density<100, preferably 2<ODF density<50, most preferably 3<ODF density<25, coexisting within the layer.

Preferably said multitextured α-Al$_2$O$_3$ layer has a rotational symmetry, fibre texture, relative to the surface normal of the coated body.

The texture is evaluated using pole figures, pole plots, orientation distribution functions (ODFs) and texture indexes from, e.g., EBSD or XRD data.

Said multitextured α-Al$_2$O$_3$ layer has a thickness between 0.5 μm and 30 μm, preferably between 0.5 μm and 20 μm, most preferably between 1 μm and 10 μm, with a columnar grain structure with an average column width between 0.1 μm and 5 μm, preferably between 0.1 μm and 2.5 μm and an untreated (as-deposited) surface roughness of Ra<1.0 μm over a length of 10 μm, preferably between 0.2 μm and 0.5 μm using a stylus profilometer. The column width is determined from back scattered SEM micrographs of polished plan views (top surface of the coating) and evaluated using, e.g., the EBSD Channel 5 program package.

In one preferred embodiment, said texture components have the highest ODF densities for {01-15}, {10-15}, {01-12}, and {10-12} satisfying one or both of the {01-15} or {10-15} solutions and one or both of {01-12} or {10-12} solutions with Euler angles:

{01-15}: 0°≤$\phi_1$≤90°, 17°<$\Phi$<47°, preferably 22°<$\Phi$<42°, and 1°<$\phi_2$<59°, preferably 10°<$\phi_2$<50°, and/or {10-15}: 0°≤$\phi_1$≤90°, 17°<$\Phi$<47°, preferably 22°<$\Phi$<42°, and 61°<$\phi_2$<119°, preferably 70°<$\phi_2$<110°, and/or and {01-12}: 0°≤$\phi_1$≤90°, 43°<$\Phi$<73°, preferably 48°<$\Phi$<68°, and 12°<$\phi_2$<48°, preferably 24°<$\phi_2$<36°, and/or {10-12}: 0°≤$\phi_1$≤90°, 43°<$\Phi$<73°, preferably 48°<$\Phi$<68°, and 72°<$\phi_2$<108°, preferably 78°<$\phi_2$<102°, and/or In another preferred embodiment, said texture components have the highest ODF densities for {01-15}, {10-15}, and {0001} satisfying one or both of the {01-15}: $0°≤\phi_1≤90°$, $17°<\Phi<47°$, preferably $22°<\Phi<42°$, and $1°<\phi_2<59°$, preferably $10°<\phi_2<50°$, and/or {01-15}: $0°≤\phi_1≤90°$, $17°<\Phi<47°$, preferably $22°<\Phi<42°$, and $61°<\phi_2<119°$, preferably $70°<\phi_2<110°$, and/or and {0001}: $0°≤\phi_1≤90°$, $0°≤\Phi<15°$, preferably $0°≤\Phi<10°$, and $0°≤\phi_2≤120°$.

In another preferred embodiment, said texture components have the highest ODF densities for {01-15}, {10-15}, and {10-10} satisfying one or both of the {01-15} or {10-15} solutions and the {10-10} solution with Euler angles:

{01-15}: $0°≤\phi_1≤90°$, $17°<\Phi<47°$, preferably $22°<\Phi<42°$, and $1°<\phi_2<59°$, preferably $10°<\phi_2<50°$, and/or {10-15}: $0°≤\phi_1≤90°$, $17°<\Phi<47°$, preferably $22°<\Phi<42°$, and $61°<\phi_2<119°$, preferably $70°<\phi_2<110°$, and/or and {10-10}: $0°≤\phi_1≤90°$, $75°<\Phi<90°$, preferably $80°<\Phi<90°$, and $15°<\phi_2<45°$, preferably $20°<\phi_2<40°$, and $75°<\phi_2<105°$, preferably $80°<\phi_2100°$.

In another preferred embodiment, said texture components have the highest ODF densities for {01-15}, {10-15}, {11-20}, and {-1-120} satisfying one or both of the {01-15} or {10-15} solutions and one or both of {11-20} or {-1-120} solutions with Euler angles:

{01-15}: $0°≤\phi_1≤90°$, $17°<\Phi<47°$, preferably $22°<\Phi<42°$, and $1°<\phi_2<59°$, preferably $10°<\phi_2<50°$, and/or {10-15}: $0°≤\phi_1≤90°$, $17°<\Phi<47°$, preferably $22°<\Phi<42°$, and $61°<\phi_2<119°$, preferably $70°<\phi_2<110°$, and/or and {11-20}: $0°≤\phi_1≤90°$, $75°<\Phi<90°$, preferably $80°<\Phi≤90°$, and $45°<\phi_2<75°$, preferably $50°<\phi_2<70°$, and/or {1-120}: $0°≤\phi_1≤90°$, $75°<\Phi≤90°$, preferably $80°<\Phi≤90°$, and $105°<\phi_2≤120°$, preferably $110°<\phi_2≤120°$.

In another preferred embodiment, said texture components have the highest ODF densities for {01-12}, {10-12} and {0001} satisfying one or both of the {01-12} or {10-12} solutions and the {0001} solution with Euler angles:

{01-12}: $0°≤\phi_1≤90°$, $43°<\Phi<73°$, preferably $48°<\Phi<68°$, and $12°<\phi_2<48°$, preferably $24°<\phi_2<36°$, and/or {10-12}: $0°≤\phi_1≤90°$, $43°<\Phi<73°$, preferably $48°<\Phi<68°$, and $72°<\phi_2<108°$, preferably $78°<\phi_2<102°$, and/or and {0001}: $0°≤\phi_1≤90°$, $0°≤\Phi<15°$, preferably $0°≤\Phi<10°$, and $0°≤\phi_2≤120°$.

In another preferred embodiment, said texture components have the highest ODF densities for {0001}, {11-20}, and {-1-120} satisfying the {0001} solution and one or both of the {11-20} or {-1-120} solutions with Euler angles:

{0001}: $0°≤\phi_1≤90°$, $0°≤\Phi<15°$, preferably $0°≤\Phi<10°$, and $0°≤\phi_2≤120°$, and {11-20}: $0°≤\phi_1≤90°$, $75°<\Phi≤90°$, preferably $80°<\Phi≤90°$, and $45°<\phi_2<75°$, preferably $50°<\phi_2<70°$, and/or {-1-120}: $0°≤\phi_1≤90°$, $75°<\Phi≤90°$, preferably $80°<\Phi≤90°$, and $105°<\phi_2≤120°$, preferably $110°<\phi_2≤120°$, and/or In another preferred embodiment, said texture components have the highest ODF densities for {0001} and {10-10} satisfying the {0001} solution and the {10-10} solution with Euler angles:

{0001}: $0°≤\phi_1≤90°$, $0°≤\Phi<15°$, preferably $0°≤\Phi<10°$, and $0°≤\phi_2≤120°$, and {10-10}: $0°≤\phi_1≤90°$, $75°<\Phi<90°$, preferably $80°<\Phi<90°$, and $15°<\phi_2<45°$, preferably $20°<\phi_2<40°$, and $75°<\phi_2<105°$, preferably $80°<\phi_2100°$.

In another preferred embodiment, said texture components have the highest ODF densities for {01-12}, {10-12}, {11-20}, and {-1-120} satisfying one or both of the {01-12} or {10-12} solutions and one or both of the {11-20} or {1-1-120} solutions with Euler angles:

{01-12}: $0°≤\phi_1≤90°$, $43°<\Phi<73°$, preferably $48°<\Phi<68°$, and $12°<\phi_2<48°$, preferably $24°<\phi_2<36°$, and/or {10-12}: $0°≤\phi_1≤90°$, $43°<\Phi<73°$, preferably $48°<\Phi<68°$, and $72°<\phi_2<108°$, preferably $78°<\phi_2<102°$, and/or and {11-20}: $0°≤\phi_1≤90°$, $75°<\Phi≤90°$, preferably $80°<\Phi≤90°$, and $45°<\phi_2<75°$, preferably $50°<\phi_2<70°$, and/or {-1-120}: $0°≤\phi_1≤90°$, $75°<\Phi≤90°$, preferably $80°<\Phi≤90°$, and $105°<\phi_2≤120°$, preferably $110°<\phi_2≤120°$, and/or In another preferred embodiment, said texture components have the highest ODF densities for {01-12}, {10-12}, and {10-10} satisfying one or both of the {01-12} or {10-12} solutions and the {10-10} solution with Euler angles:

{01-12}: $0°≤\phi_1≤90°$, $43°<\Phi<73°$, preferably $48°<\Phi<68°$, and $12°<\phi_2<48°$, preferably $24°<\phi_2<36°$, and/or {10-12}: $0°≤\phi_1≤90°$, $43°<\Phi<73°$, preferably $48°<\Phi<68°$, and $72°<\phi_2<108°$, preferably $78°<\phi_2<102°$, and/or and {10-10}: $0°≤\phi_1≤90°$, $75°<\Phi<90°$, preferably $80°<\Phi<90°$, and $15°<\phi_2<45°$, preferably $20°<\phi_2<75°$, and/or In another preferred embodiment, said texture components have the highest ODF densities for {10-10}, {11-20}, and {−1-120} satisfying the {10-10} solution and one or both of the {11-20} or {−1-120} solutions with Euler angles:

{10-10}: $0° \le \phi_1 \le 90°$, $17° < \Phi < 90°$, preferably $80° < \Phi < 90°$, and $15° < \phi_2 < 45°$, preferably $80° < \phi_2 < 100°$, and {11-20}: $0° \le \phi_1 \le 90°$, $75° < \Phi \le 90°$, preferably $80° < \Phi \le 90°$, and $45° < \phi_2 < 75°$, preferably $50° < \phi_2 < 70°$, and/or {−1-120}: $0° \le \phi_1 \le 90°$, $75° < \Phi \le 90°$, preferably $80° < \Phi \le 90°$, and $105° < \phi_2 \le 120°$, preferably $110° < \phi_2 \le 120°$.

In another preferred embodiment, said texture components have the highest ODF densities for {01-15}, {10-15}, {0001}, and {10-10} satisfying one or both of the {10-15} or {01-15} solutions and the {0001} solution and the {10-10} solution with Euler angles:

{01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or {10-15}: $0° \le \phi_1 \le 90°$, $17° < \Phi < 47°$, preferably $22° < \Phi < 42°$, and $61° < \phi_2 < 119°$, preferably $70° < \phi_2 < 110°$, and/or and {0001}: $0° \le \phi_1 \le 90°$, $0° \le \Phi < 15°$, preferably $0° \le \Phi < 10°$, and $0° \le \phi_2 \le 120°$, and {10-10}: $0° \le \phi_1 \le 90°$, $75° < \Phi < 90°$, preferably $80° < \Phi < 90°$, and $15° < \phi_2 < 45°$, preferably $20° < \phi_2 < 40°$, and $75° < \phi_2 < 105°$, preferably $80° \phi_2 < 100°$.

In another preferred embodiment, said texture components have the highest ODF densities for {01-12}, {10-12}, {0001}, and {10-10} satisfying one or both of the {01-12} or {10-12} solutions and the {0001} solution and the {10-10} solution with Euler angles:

{01-12}: $0° \le \phi_1 \le 90°$, $43° < \Phi < 73°$, preferably $48° < \Phi < 68°$, and $12° < \phi_2 < 48°$, preferably $24° < \phi_2 < 36°$, and/or {10-12}: $0° \le \phi_1 \le 90°$, $43° < \Phi < 73°$, preferably $48° < \Phi < 68°$, and $72° < \phi_2 < 108°$, preferably $78° < \phi_2 < 102°$, and {0001}: $0° \le \phi_1 \le 90°$, $0° \le \Phi < 15°$, preferably $0° \le \Phi < 10°$, and $0° \le \phi_2 \le 120°$, and {10-10}: $0° \le \phi_1 \le 90°$, $75° < \Phi < 90°$, preferably $80° < \Phi < 90°$, and $15° < \phi_2 < 45°$, preferably $20° < \phi_2 < 40°$, and $75° < \phi_2 < 105°$, preferably $80° < \phi_2 < 100°$.

In another preferred embodiment, said texture components have the highest ODF densities for {01-15}, {10-15}, {0001}, {11-20}, and {−1-120} satisfying one or both of the {10-15} or {01-15} solutions and the {0001} solution and one or both of the {11-20} or {−1-120} solutions with Euler angles:

{01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or {10-15}: $0° \le \phi_1 \le 90°$, $17° < \Phi < 47°$, preferably $22° < \Phi < 42°$, and $61° < \phi_2 < 119°$, preferably $70° < \phi_2 < 110°$, and {0001}: $0° \le \phi_1 \le 90°$, $0° \le \Phi < 15°$, preferably $0° \le \Phi < 10°$, and $0° \le \phi_2 \le 120°$, and {11-20}: $0° \le \phi_1 \le 90°$, $75° < \Phi \le 90°$, preferably $80° < \Phi \le 90°$, and $45° < \phi_2 < 75°$, preferably $50° < \phi_2 < 70°$, and/or {−1-120}: $0° \le \phi_1 \le 90°$, $75° < \Phi \le 90°$, preferably $80° < \Phi \le 90°$, and $105° < \phi_2 \le 120°$, preferably $110° < \phi_2 \le 120°$.

In another preferred embodiment, said texture components have the highest ODF densities for {01-15}, {10-15}, {01-12}, {10-12}, and {0001} satisfying one or both of the {10-15} or {01-15} solutions and one or both of the {01-12} or {10-12} solutions and the {0001} solution with Euler angles:

{01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or {01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and {01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or {01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or and {01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or In another preferred embodiment, said texture components have the highest ODF densities for {01-15}, {10-15}, {10-10}, {01-12}, and {10-12} satisfying one or both of the {10-15} or {01-15} solutions and the {0001} solution and one or both of the {01-12} or {10-12} solutions with Euler angles:

{01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or {01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or and {01-15}: $0° \le \phi_1 \le 90°$, $17° < \Phi < 47°$, preferably $22° < \Phi < 42°$, and $1° < \phi_2 < 59°$, preferably $10° < \phi_2 < 50°$, and/or and {01-15}: $0° \leq \phi_1 \leq 90°$, $17° < \Phi < 47°$, preferably
$22° < \Phi < 42°$, and $1° < \phi_2 < 59°$, preferably
$10° < \phi_2 < 50°$, and/or {01-15}: $0° \leq \phi_1 \leq 90°$, $17° < \Phi < 47°$, preferably
$22° < \Phi < 42°$, and $1° < \phi_2 < 59°$, preferably
$10° < \phi_2 < 50°$, and/or In another preferred embodiment, said texture components have the highest ODF densities for {01-15}, {10-15}, {10-10}, {01-12}, {10-12}, and {0001} satisfying one or both of the {10-15} or {01-15} solutions and {10-10} solution and one or both of the {01-12} or {10-12} solutions and the {0001} solution with Euler angles:

{01-15}: $0° \leq \phi_1 \leq 90°$, $17° < \Phi < 47°$, preferably
$22° < \Phi < 42°$, and $1° < \phi_2 < 59°$, preferably
$10° < \phi_2 < 50°$, and/or {10-15}: $0° \leq \phi_1 \leq 90°$, $17° < \Phi < 47°$, preferably
$22° < \Phi < 42°$, and $61° < \phi_2 < 119°$, preferably
$70° < \phi_2 < 110°$, and {10-10}: $0° \leq \phi_1 \leq 90°$, $75° < \Phi < 90°$, preferably
$80° < \Phi < 90°$, and $15° < \phi_2 < 45°$, preferably
$20° < \phi_2 < 40°$, and $75° < \phi_2 < 105°$, and {01-12}: $0° \leq \phi_1 \leq 90°$, $43° < \Phi < 73°$, preferably
$48° < \Phi < 68°$, and $12° < \phi_2 < 48°$, preferably
$24° < \phi_2 < 36°$, and/or {10-12}: $0° \leq \phi_1 \leq 90°$, $43° < \Phi < 73°$, preferably
$48° < \Phi < 68°$, and $72° < \phi_2 < 108°$, preferably
$78° < \phi_2 < 102°$, and {0001}: $0° \leq \phi_1 \leq 90°$, $0° \leq \Phi < 15°$, preferably $0° \leq \Phi < 10°$,
and $0° \leq \phi_2 \leq 120°$.

Said coating may comprise of an inner single- and/or multilayers of, e.g. TiN, TiC or Ti(C,O,N) or other $Al_2O_3$ polymorphs, preferably Ti(C,O,N), and/or an outer single- and/or multilayers of, e.g. TiN, TiC, Ti(C,O,N) or other $Al_2O_3$ polymorphs, preferably TiN and/or Ti(C,O,N), to a total thickness 0.5 to 40 µm, preferably 0.5 to 30 µm, and most preferably 1 to 20 µm, according to prior art.

Optionally, said coated body is post treated with, e.g., wet blasting, brushing operation, etc. such that the desired surface quality is obtained.

According to the invention, the deposition method for the multitextured $\alpha$-$Al_2O_3$ layer of the present invention is based on chemical vapour deposition at a temperature between 950 C and 1050 C in mixed $H_2$, $CO_2$, CO, $H_2S$, HCl and $AlCl_3$ at a gas pressure between 50 and 150 mbar as known in the art. During deposition, the $CO_2$/CO gas flow ratio is periodically or aperiodically varied, upwards and downwards, continuously or stepwise between at least two gas flow ratios chosen within the interval $0.3 \leq (CO_2/CO) \leq 6$ and with a difference of at least 0.1. The time between the starting points for the chosen gas flow ratios is between 1 and 60 minutes, preferably between 2 and 30 minutes. It is within the purview of the skilled artisan to determine the detailed process conditions in accordance with the present description.

This invention also relates to the use of cutting tool inserts according to the above for machining by chip removal at cutting speeds between 75 and 600 m/min, preferably between 150 and 600 m/min, with an average feed, per tooth in the case of milling, between 0.08 and 0.5 mm, preferably between 0.1 and 0.4 mm depending on cutting speed and insert geometry.

Example 1

Cemented carbide inserts with the composition 5.5 wt % Co, 8 wt % cubic carbides and balance WC, were initially coated with a 6 µm thick layer of MTCVD Ti(C,N). In subsequent process steps and during the same coating cycle, a 5 µm thick layer of a multitextured $\alpha$-$Al_2O_3$ was deposited with the general process conditions given in table 1 and the specific process conditions, indexed with A, B, C and D, given in table 2. The $\alpha$-$Al_2O_3$ layer was deposited with a periodical and continuous change between process conditions A, B, C and D, and in time steps set by the process time ratios $t_A$: $t_B$: $t_C$: $t_D$ where i=A, B, C, D, is the time between two consecutive process conditions. The period time is $t_A + t_B + t_C + t_D$.

TABLE 1

| General process conditions | |
|---|---|
| $CO_2$ + CO/% | 7.5 |
| $AlCl_3$/% | 2 |
| $H_2S$/% | 0.3 |
| HCl/% | 2 |
| $H_2$/% | Balance |
| Pressure/mbar | 70 |
| Temperature/° C. | 1000 |

TABLE 2

| | Specific process conditions (A, B, C and D) | | |
|---|---|---|---|
| Insert # | $(CO_2/CO)_A$:$(CO_2/CO)_B$:$(CO_2/CO)_C$:$(CO_2/CO)_D$ | $t_A$:$t_B$:$t_C$:$t_D$ | Period time |
| 1 | 1:2:n.a.:n.a. | 1:1:n.a.:n.a | 40 min |
| 2 | 1:2:n.a.:n.a. | 1:1:n.a.:n.a | 20 min |
| 3 | 1:2:n.a.:n.a. | 1:1:n.a.:n.a | 10 min |
| 4 | 1:2:n.a.:n.a | 1:2:n.a.:n.a | 30 min |
| 5 | 1:2:n.a.:n.a | 1:3:n.a.:n.a | 40 min |
| 6 | 0.5:1:n.a.:n.a | 1:1:n.a.:n.a | 20 min |
| 7 | 0.5:1:n.a.:n.a | 1:2:n.a.:n.a | 30 min |
| 8 | 0.5:1:n.a.:n.a | 1:3:n.a.:n.a | 40 min |
| 9 | 0.5:2:n.a.:n.a | 1:1:n.a.:n.a | 20 min |
| 10 | 0.5:2:n.a.:n.a | 1:2:n.a.:n.a | 30 min |
| 11 | 0.5:2:n.a.:n.a | 1:3:n.a.:n.a | 20 min |
| 12 | 0.5:2:n.a.:n.a | 1:3:n.a.:n.a | 40 min |
| 13 | 2:5:n.a.:n.a | 1:1:n.a.:n.a | 20 min |
| 14 | 2:5:n.a.:n.a | 1:2:n.a.:n.a | 30 min |
| 15 | 2:5:n.a.:n.a | 1:3:n.a.:n.a | 40 min |
| 16 | 0.5:5:n.a.:n.a | 1:1:n.a.:n.a | 20 min |
| 17 | 0.5:5:n.a.:n.a | 1:2:n.a.:n.a | 30 min |
| 18 | 0.5:5:n.a.:n.a | 1:3:n.a.:n.a | 40 min |
| 19 | 0.5:1:2:n.a. | 3:1:2:n.a. | 60 min |
| 20 | 1:2:5:n.a. | 3:1:1:n.a. | 50 min |
| 21 | 1:2:5:n.a. | 3:1:1:n.a. | 25 min |
| 22 | 0.5:1:5:n.a. | 2:1:1:n.a. | 40 min |
| 23 | 0.5:2:5:n.a. | 1:1:1:n.a. | 30 min |
| 24 | 0.5:1:2:5 | 1:1:1:1 | 40 min |

Example 2

Example 1 was repeated with a single textured $\alpha$-$Al_2O_3$ layer using a constant $CO_2$/CO gas flow ratio of 2.0.

Example 3

$\alpha$-$Al_2O_3$ layers from example 1 and 2 were characterized by SEM and EBSD using a LEO Ultra 55 scanning electron microscope operated at 15 kV and equipped with a HKL Nordlys II EBSD detector. The texture was evaluated from the EBSD data by constructing ODF's with series expansion having a resolution of 32×32×32 points and a Gaussian half width of 5° and $L_{max}$=34 clustering data of 5° over a representative area of a polished top surface of the α-Al$_2$O$_3$ layers. The commercial Channel 5 software version 5.0.9.0 was used for data collection and also for data analyses: calculations of ODFs, i.e. the Euler angles and densities as well as texture indexes, pole figures, and pole plots.

Figure 2A:
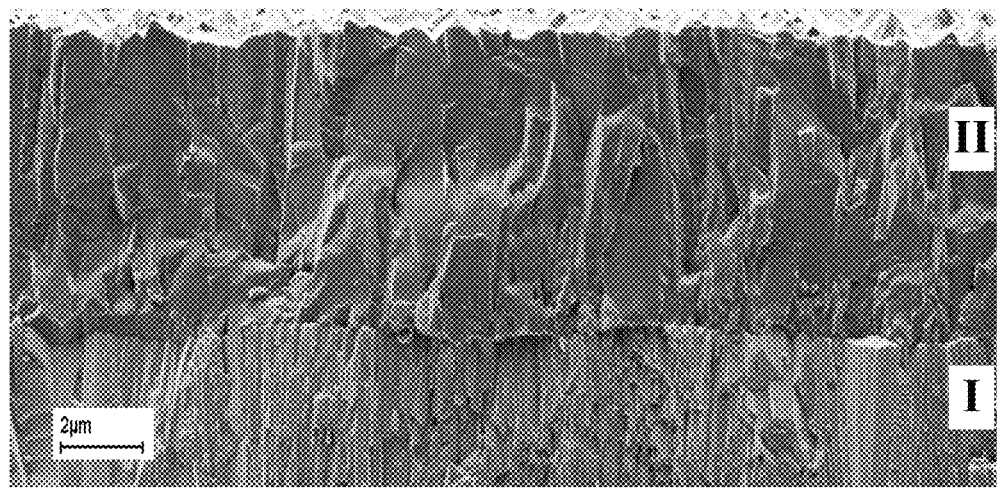
FIG. 2. SEM micrographs of fractured cross sections of (a) a multitextured {01-15}+{10-15}+{01-12}+{10-12} α-Al$_2$O$_3$ layer (II) and Ti(C,N) layer (I) according to the invention and (b) a single textured {0001} α-Al$_2$O$_3$ layer (II) and Ti(C,N) layer (I) according to prior art.
Figure 2B:
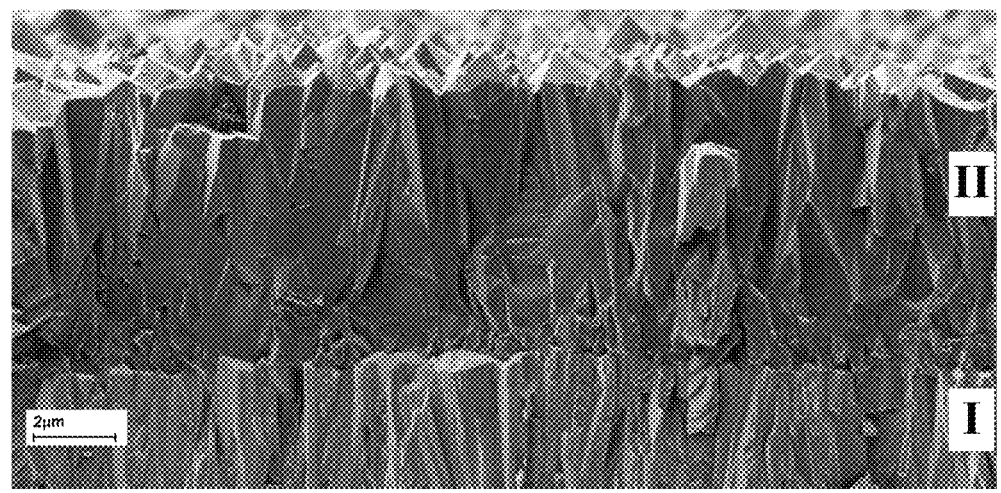

FIG. 2 shows back scattered SEM micrographs of polished cross sections of the α-Al$_2$O$_3$ layers, marked with II in the images, for (a) insert 2 in example 1 (invention) and (b) example 2 (reference). Both layers exhibit a columnar grain to structure. The invention layers show a strong reduction of the surface roughness.

The surface roughness of insert 2 in example 1 was Ra=0.35 μm as measured by a stylus profilometer over a length of 10 μm.

Figure 3:
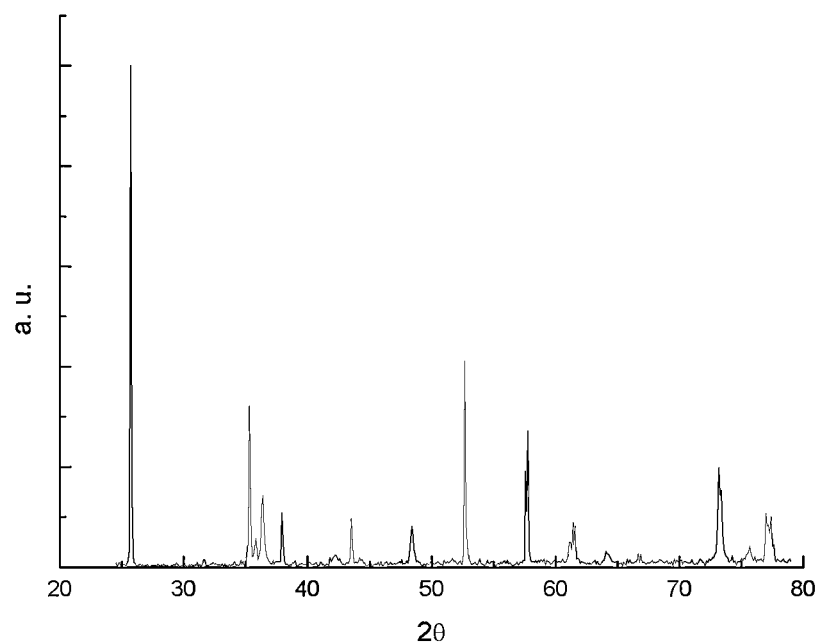
FIG. 3. X-ray diffraction (XRD) pattern from a multitextured {01-15}+{10-15}+{01-12}+{10-12} α-Al$_2$O$_3$ layer according to the invention.

FIG. 3 shows X-ray diffraction (XRD) patterns from insert 2 in example 1 demonstrating a multitextured {01-15}+{10-15}+{01-12}+{10-12} α-Al$_2$O$_3$ layer.

Figure 4A:
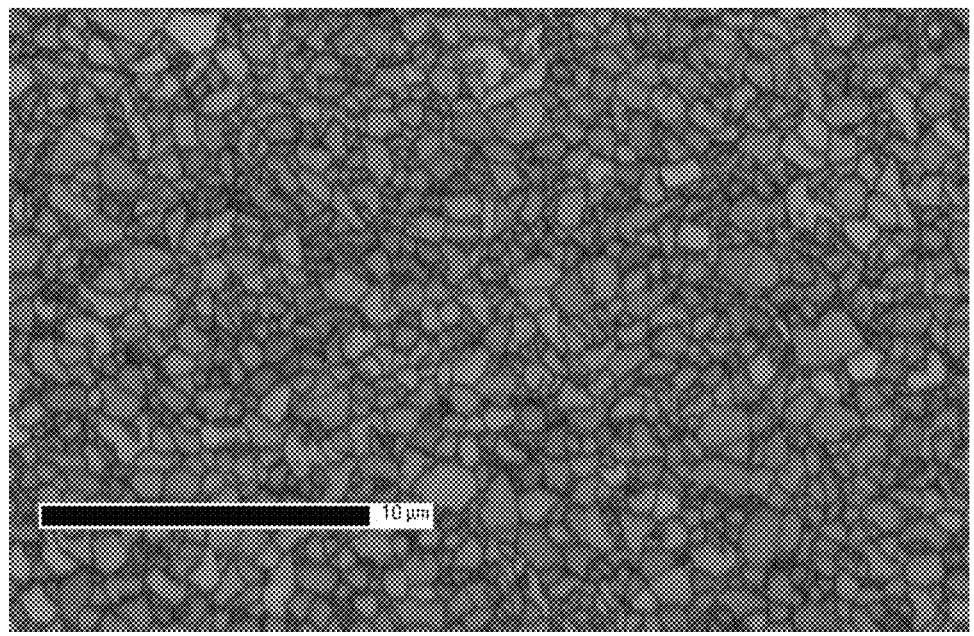
FIG. 4. Back scattered SEM micrographs of polished plan views of (a) a multitextured {01-15}+{10-15}+{01-12}+{10-12} α-Al$_2$O$_3$ layer according to the invention and (b) a single textured {0001} α-Al$_2$O$_3$ layer according to prior art.
Figure 4B:
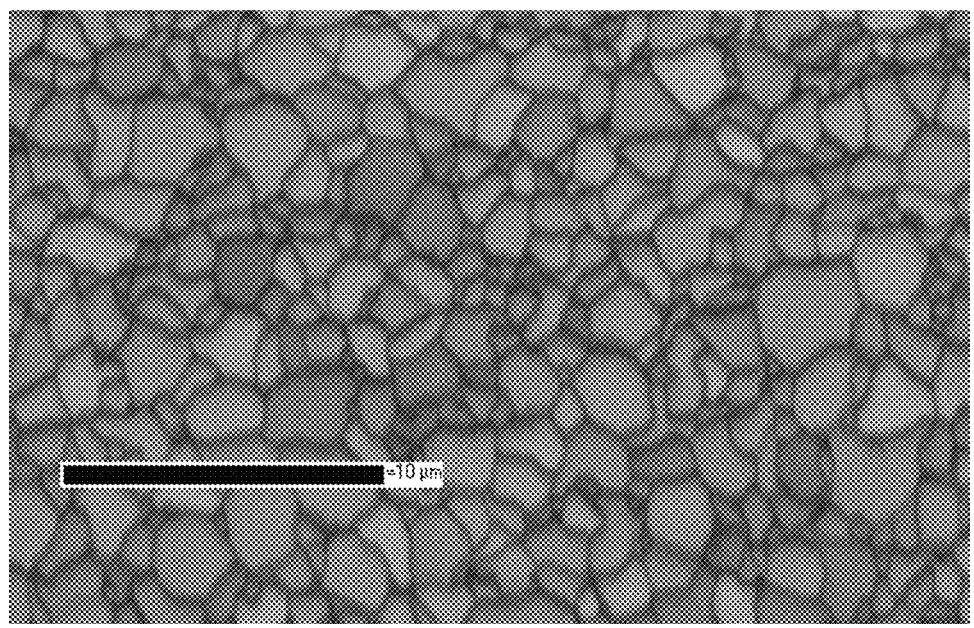
Figure 5:
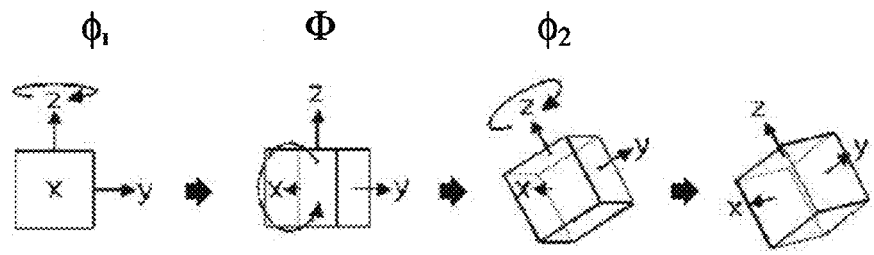
FIG. 5. Definition of the Euler angles $\phi_1$, $\Phi$, and $\phi_2$ used in the ODF representation with respect to the crystallographic orientations.

FIG. 4 shows back scattered SEM micrographs of polished plan views of (a) a multitextured {01-15}+{10-15}+{01-12}+{10-12} α-Al$_2$O$_3$ layer of insert 2 in example 1 and (b) a single textured {0001} α-Al$_2$O$_3$ layer of example 2. The invention layers show reduced column width, in average between 0.1 μm and 2.5 μm as determined from back scattered SEM micrographs of polished plan views (top surface of the coating) and evaluated using, e.g., the EBSD Channel 5 program package.

Figure 6A:
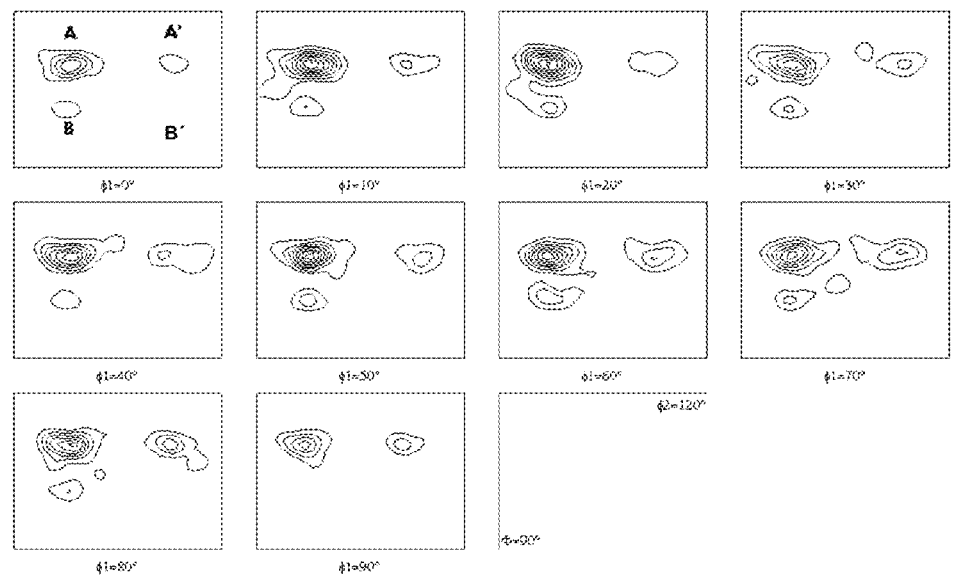
FIG. 6. ODF contouring charts (Euler angles and densities) of (a) a multitextured {01-15}+{10-15}+{01-12}+{10-12} α-Al$_2$O$_3$ layer, denoted as A, A', B and B' respectively, according to the invention with its {01-15}, {10-15}, {01-12}, and {10-12} solutions and (b) a single textured {0001} α-Al$_2$O$_3$ layer according to prior art.
Figure 6B:
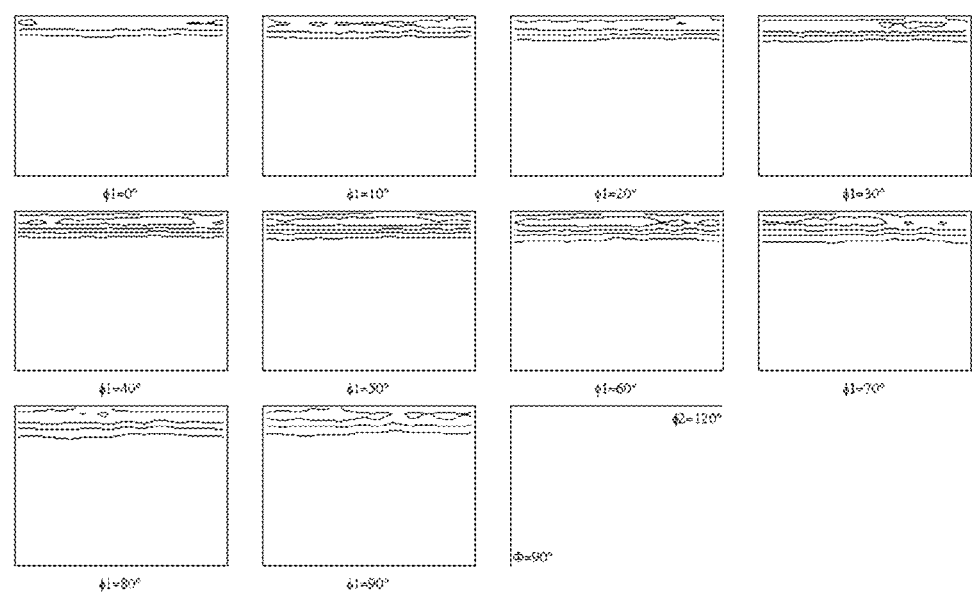

FIG. 6 shows ODF contour charts (ODF Euler angles and densities) as deduced from the EBSD data of (a) a multitextured {01-15}+{10-15}+{01-12}+{10-12} α-Al$_2$O$_3$ layer from insert 2 in example 1 (table 2) with the {01-15}, {10-15}, {01-12} and {10-12} solutions and an ODF texture index of 4.06, and (b) of a single textured {0001}α-Al$_2$O$_3$ layer of example 2 with an ODF texture index of 5.5. The Euler angles $\phi_1$, $\Phi$ and $\phi_2$ for the {01-15}, {10-15}, {01-12} and {10-12} solutions of the {01-15}, {10-15}, {01-12}, and {10-12} texture components are centred (highest ODF density) at about {01-15}:0°≤$\phi_1$≤90°, $\Phi$=32° and $\phi_2$=30°, {10-15}:0°≤$\phi_1$≤90°, $\Phi$=32° and $\phi_2$=90°, {01-12}:0°≤$\phi_1$≤90°, $\Phi$=58° and $\phi_2$=30°, and {10-12}:0°≤$\phi_1$≤90°, $\Phi$=58° and $\phi_2$=90°.

From the Channel 5 software, the ODF density values for the {01-15} and {01-12} texture components were deduced as 17.7 and 6.2, respectively. The results demonstrate a multitextured {01-15}+{01-12} fibre texture.

The texture index and texture components with its corresponding ODF densities for the inserts in example 1 are shown in table 3.

TABLE 3

| Insert # | Texture index | Dominant texture component/ODF density | | | |
|---|---|---|---|---|---|
| 1 | 3.98 | {01-15}/16.5 | {01-12}/6.1 | | |
| 2 | 4.06 | {01-15}/17.7 | {01-12}/6.2 | | |
| 3 | 4.22 | {01-15}/17.3 | {01-12}/5.9 | | |
| 4 | 3.94 | {01-15}/10.3 | {01-12}/12.4 | | |
| 5 | 4.14 | {01-15}/8.2 | {01-12}/19.2 | | |

TABLE 3-continued

| Insert # | Texture index | Dominant texture component/ODF density | | | |
|---|---|---|---|---|---|
| 6 | 3.81 | {01-15}/12.0 | {0001}/4.2 | | |
| 7 | 2.54 | {01-15}/6.9 | {0001}/6.3 | | |
| 8 | 4.44 | {01-15}/5.1 | {0001}/15.2 | | |
| 9 | 4.91 | {01-12}/15.9 | {0001}/3.1 | | |
| 10 | 2.79 | {01-12}/5.7 | {0001}/7.1 | | |
| 11 | 4.91 | {01-12}/3.2 | {0001}/13.9 | | |
| 12 | 4.83 | {01-12}/3.3 | {0001}/14.4 | | |
| 13 | 5.56 | {01-12}/19.4 | {10-10}/6.0 | | |
| 14 | 4.67 | {01-12}/13.2 | {10-10}/21.0 | | |
| 15 | 5.93 | {01-12}/7.6 | {10-10}/24.0 | | |
| 16 | 3.25 | {0001}/14.0 | {10-10}/4.3 | | |
| 17 | 2.95 | {0001}/5.9 | {10-10}/13.4 | | |
| 18 | 3.85 | {0001}/3.1 | {10-10}/14.7 | | |
| 19 | 2.72 | {01-15}/9.6 | {01-12}/3.5 | {0001}/5.2 | |
| 20 | 3.48 | {01-15}/15.5 | {01-12}/5.0 | {10-10}/7.7 | |
| 21 | 3.34 | {01-15}/14.9 | {01-12}/4.9 | {10-10}/7.5 | |
| 22 | 2.79 | {01-15}/10.0 | {0001}/5.4 | {10-10}/5.0 | |
| 23 | 2.36 | {0001}/6.6 | {01-12}/4.2 | {10-10}/6.4 | |
| 24 | 1.78 | {01-15}/5.9 | {01-12}/4.7 | {0001}/4.5 | {10-10}/5.2 |

In addition, pole figures and pole plots of the fibre textures were plotted.

Figure 7A:
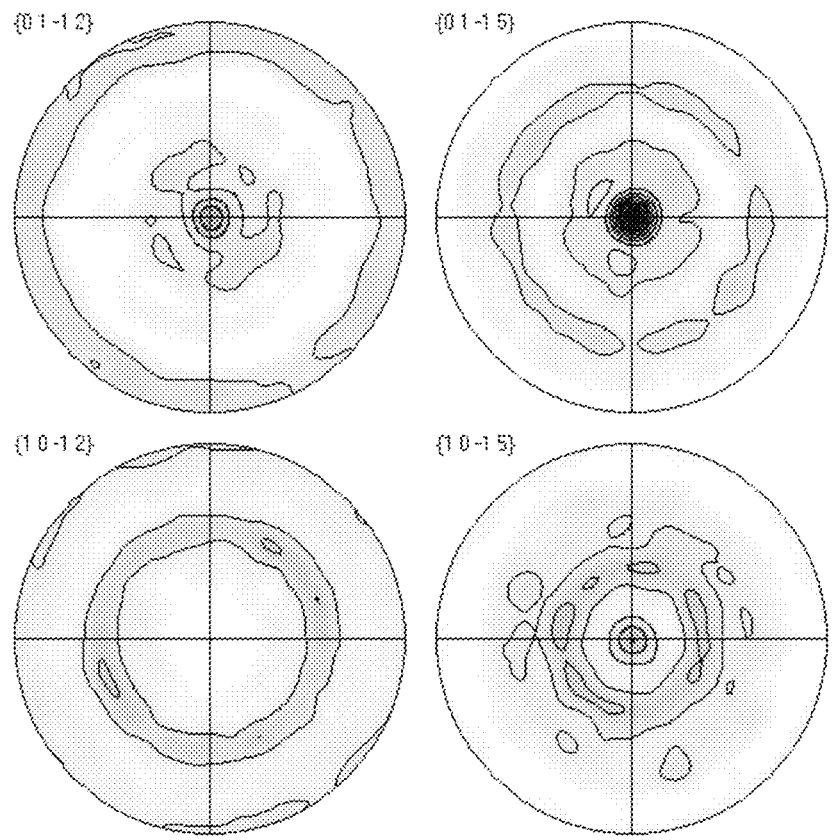
FIG. 7. EBSD pole figures of (a) {01-12}, {01-15}, {10-12}, and {10-15} texture components and (b) {0001} textured α-Al$_2$O$_3$ layer according to prior art.
Figure 7B:
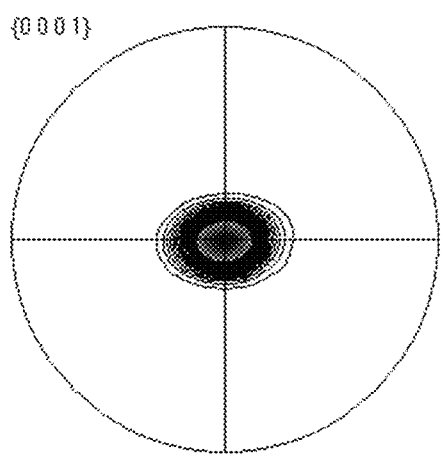
Figure 8A:
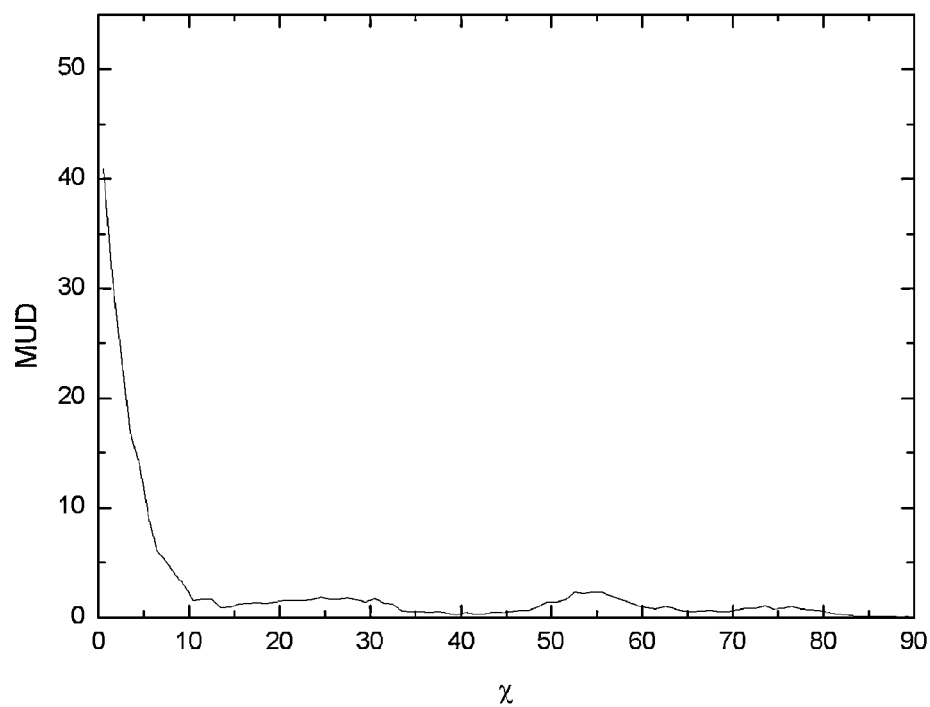
FIG. 8. EBSD pole plots of (a) {01-15} texture component, (b) {10-15} texture component, (c) {01-12} texture component, (d) {10-12} texture component of a multitextured {01-15}+{10-15}+{01-12}+{10-12} α-Al$_2$O$_3$ layer and (e) a single textured {0001} α-Al$_2$O$_3$ layer according to prior art. χ is the angle from the centre (χ=0) to the rim (χ=90) of the pole figures (cf.
Figure 8B:
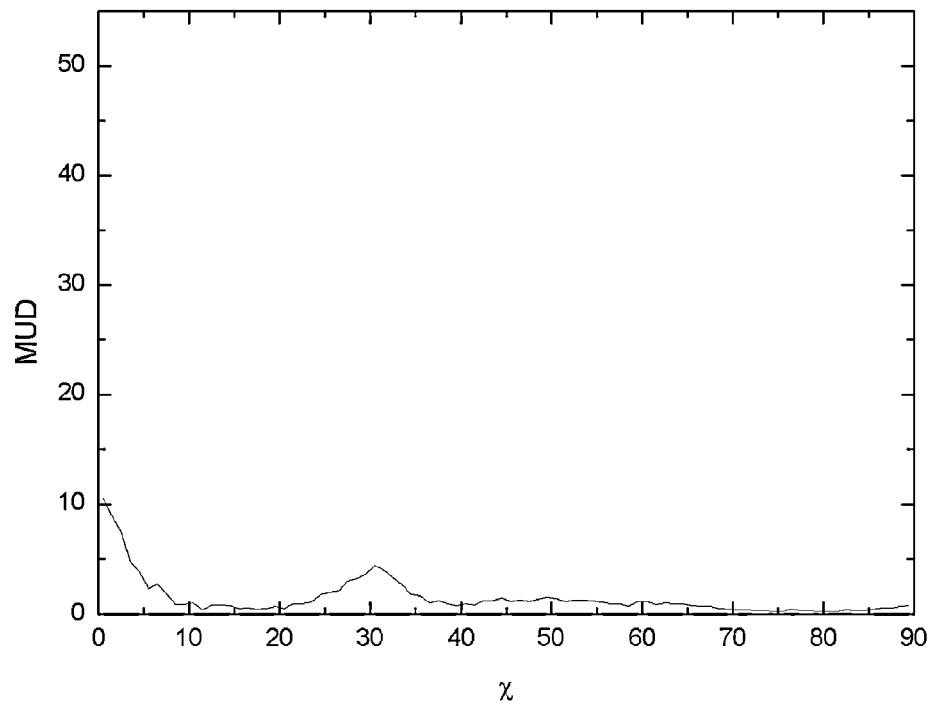
Figure 8C:
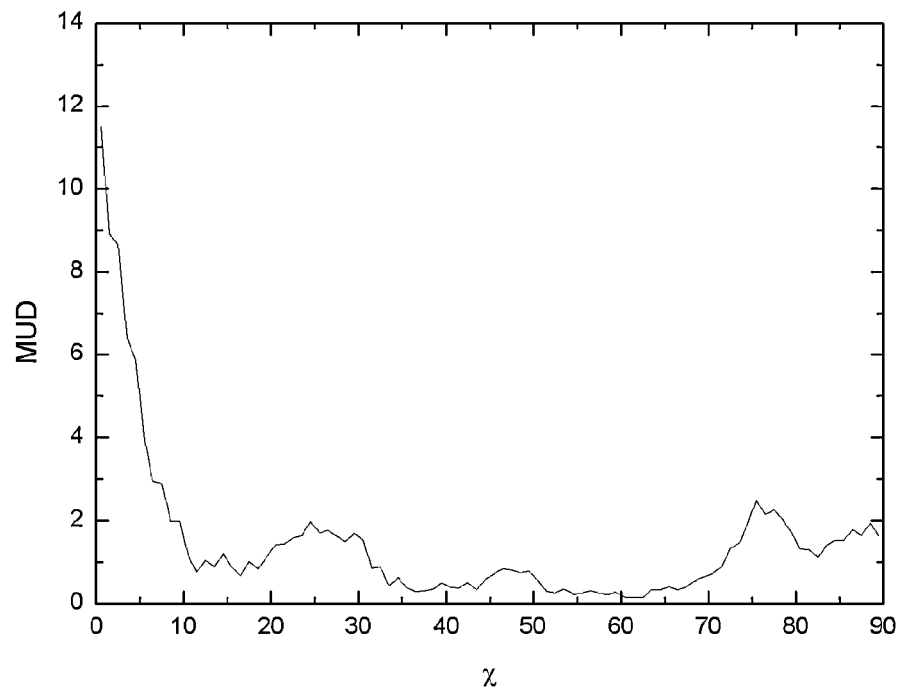
Figure 8D:
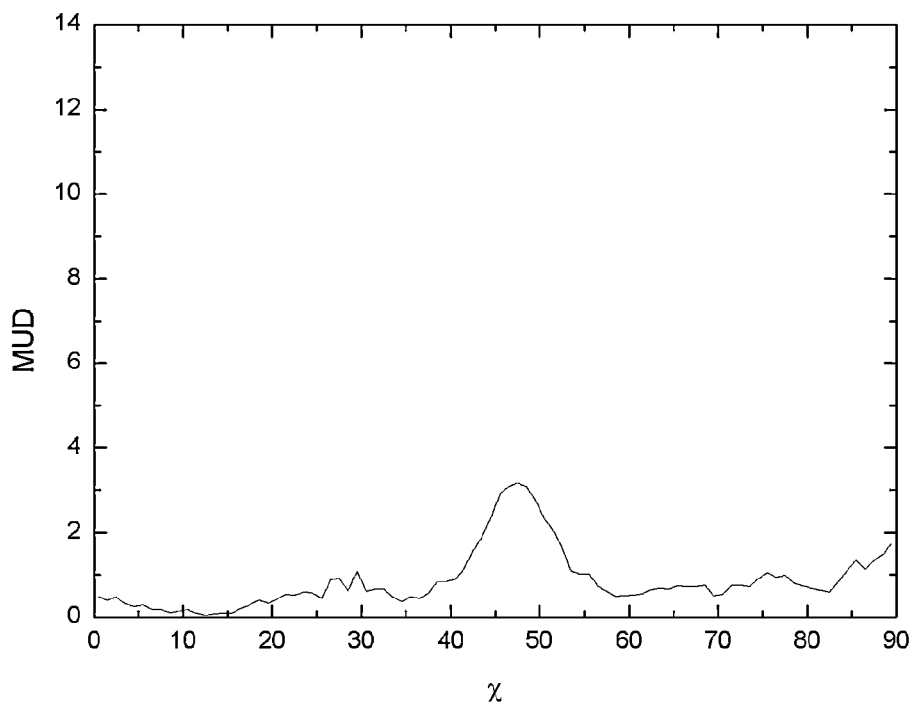
Figure 8E:
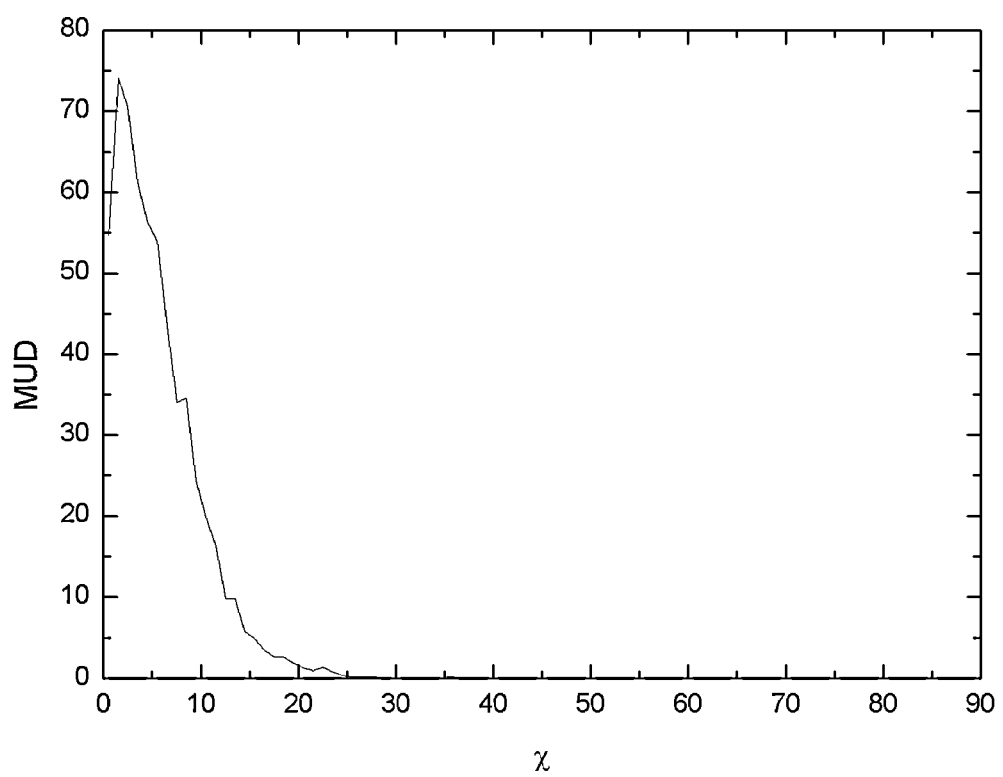

FIG. 7 shows pole figures of (a) {01-15}, {10-15}, {01-12}, and {10-12} texture components of insert 2 in example 1 and (b) {0001} textured α-Al$_2$O$_3$ layer of example 2.

FIG. 8 shows pole plots of (a) {01-15} texture component, (b) {10-15} texture component, (c) {01-12} texture component, (d) {10-12} texture component of insert 2 in example 1 and (e) a single textured {0001}α-Al$_2$O$_3$ layer of example 2. χ is the angle from the centre (χ=0) to the rim (χ=90) of the pole figures (cf. FIG. 4). MUD is the multiples of unit distribution.

Example 4

Coated inserts from example 1 and example 2 together with competitor grades were tested in a continuous turning application at the following cutting conditions.
Work piece: Cylindrical bar
Material: SS1672
Insert type: CNMG120408
Cutting speed: 300 m/min
Feed: 0.35 mm/rev
Depth of cut: 2.5 mm
Remarks: dry
Life time for crater wear was used as criterion.

TABLE 4

| Insert | Time/minutes |
|---|---|
| Example1: Insert 1 | 15 |
| Example1: Insert 2 | 14 |
| Example1: Insert 3 | 14 |
| Example1: Insert 4 | 13.5 |
| Example 2 | 13 |
| Competitor X | 13 |
| Competitor Y | Break down |
| Competitor Z | 11 |

Example 5

Coated inserts from example 1 and example 2 together with a competitor grade were tested in a continuous turning application at the following cutting conditions.
Work piece: Cylindrical bar
Material: SS2258

Insert type: CNMG120408
Cutting speed: 220 m/min
Feed: 0.35 mm/rev
Depth of cut: 2.5 mm
Remarks: dry
Life time for crater wear was used as criterion.

TABLE 5

| Insert | Time/minutes |
|---|---|
| Example1: insert 2 | 12 |
| Example1: insert 12 | 12 |
| Example1: insert 19 | 13 |
| Example 2 | 11 |
| Competitor X | 10 |

Example 6

Coated inserts from example 1 and example 2 together with a competitor grade were tested in a continuous turning application at the following cutting conditions.
Work piece: Cylindrical bar
Material: SS2348
Insert type: CNMG120408
Cutting speed: 180 m/min
Feed: 0.35 mm/rev
Depth of cut: 2.5 mm
Remarks: dry
Life time for crater wear was used as criterion.

TABLE 6

| Insert | Time/minutes |
|---|---|
| Example1: insert 1 | 17 |
| Example1: insert 5 | 18 |
| Example 2 | 16 |
| Competitor X | 16 |

The invention claimed is:

1. A cutting tool insert for machining by chip removal comprising a body of a hard alloy of cemented carbide, cermet, ceramics or cubic boron nitride based material onto which a hard and wear resistant coating is deposited by CVD comprising:
   at least one $\alpha$-$Al_2O_3$ layer with a thickness between 0.5 μm and 30 μm, having
   an ODF texture index>1, and
   at least two dominant texture components with 2<ODF density<100 coexisting within the layer.

2. The cutting tool insert according to claim 1, wherein 1<ODF texture index<50.

3. The cutting tool insert according to claim 1, wherein 1<ODF texture index<10.

4. The cutting tool insert according to claim 1, wherein 2<ODF density<50.

5. The cutting tool insert according to claim 1, wherein 3<ODF density<25.

6. The cutting tool insert according to claim 1, wherein said layer is fibre textured.

7. The cutting tool insert according to claim 1, wherein said layer has a columnar grain structure with an average column width between 0.1 μm and 5 μm.

8. The cutting tool insert according to claim 1, wherein said layer has a surface roughness Ra<1.0 μm.

9. The cutting tool insert according to claim 1, wherein said layer comprises texture components with Euler angles $0° \leq \phi_1 \leq 90°$, $17° < \Phi < 47°$, and $1° < \phi_2 < 59°$, and/or $0° \leq \phi_1 \leq 90°$, $17° < \Phi < 47°$, and $61° < \phi_2 < 119°$, and $0° \leq \phi_1 \leq 90°$, $43° < \Phi < 73°$, and $12° < \phi_2 < 48°$, and/or $0° \leq \phi_1 \leq 90°$, $43° < \Phi < 73°$, and $72° < \phi_2 < 108°$.

10. The cutting tool insert according to claim 1, wherein that said layer comprises texture components with Euler angles $0° \leq \phi_1 \leq 90°$, $17° < \Phi < 47°$, and $1° < \phi_2 < 59°$, $0° \leq \phi_1 \leq 90°$, $17° < \Phi < 47°$, and $61° < \phi_2 < 119°$, and $0° \leq \phi_1 \leq 90°$, $0° \leq \Phi < 15°$, and $0° \leq \phi_2 \leq 120°$.

11. The cutting tool insert according to claim 1, wherein said layer comprises texture components with Euler angles $0° \leq \phi_1 \leq 90°$, $17° < \Phi < 47°$, and $1° < \phi_2 < 59°$, and/or $0° \leq \phi_1 \leq 90°$, $17° < \Phi < 47°$, and $61° < \phi_2 < 119°$, and $0° \leq \phi_1 \leq 90°$, $75° < \Phi < 90°$, and $15° < \phi_2 < 45°$, and $75° < \phi_2 < 105°$.

12. The cutting tool insert according to claim 1, wherein said layer comprises texture components with Euler angles $0° \leq \phi_1 \leq 90°$, $17° < \Phi < 47°$, and $1° < \phi_2 < 59°$, and/or $0° \leq \phi_1 \leq 90°$, $17° < \Phi < 47°$, and $61° < \phi_2 < 119°$, and $0° \leq \phi_1 \leq 90°$, $75° < \Phi \leq 90°$, and $45° < \phi_2 < 75°$, and/or $0° \leq \phi_1 \leq 90°$, $75° < \Phi \leq 90°$, and $105° < \phi_2 \leq 120°$.

13. The cutting tool insert according to claim 1, wherein said layer comprises texture components with Euler angles $0° \leq \phi_1 \leq 90°$, $43° < \Phi < 73°$, and $12° < \phi_2 < 48°$, and/or $0° \leq \phi_1 \leq 90°$, $43° < \Phi < 73°$, and $72° < \phi_2 < 108°$, and $0° \leq \phi_1 \leq 90°$, $0° \leq \Phi < 15°$, and $0° \leq \phi_2 \leq 120°$.

14. The cutting tool insert according to claim 1, wherein said layer comprises texture components with Euler angles $0° \leq \phi_1 \leq 90°$, $0° \leq \Phi < 15°$, and $0° \leq \phi_2 \leq 120°$, and $0° \leq \phi_1 \leq 90°$, $75° < \Phi \leq 90°$, and $45° < \phi_2 < 75°$ and/or $0° \leq \phi_1 \leq 90°$, $75° < \Phi \leq 90°$, and $105° < \phi_2 \leq 120°$.

15. The cutting tool insert according to claim 1, wherein said layer comprises texture components with Euler angles $0° \leq \phi_1 \leq 90°$, $0° \leq \Phi < 15°$, and $0° \leq \phi_2 \leq 120°$, and $0° \leq \phi_1 \leq 90°$, $75° < \Phi < 90°$, and $15° < \phi_2 < 45°$, and $75° < \phi_2 < 105°$.

16. The cutting tool insert according to claim 1, wherein said layer comprises texture components with Euler angles $0° \leq \phi_1 \leq 90°, 43° < \Phi < 73°,$ and $12° < \phi_2 < 48°,$ and/or $0° \leq \phi_1 \leq 90°, 43° < \Phi < 73°,$ and $72° < \phi_2 < 108°$ and $0° \leq \phi_1 \leq 90°, 75° < \Phi \leq 90°,$ and $45° < \phi_2 < 75°,$ and/or $0° \leq \phi_1 \leq 90°, 75° < \Phi \leq 90°,$ and $105° < \phi_2 \leq 120°.$

17. The cutting tool insert according to claim 1, wherein said layer comprises texture components with Euler angles $0° \leq \phi_1 \leq 90°, 43° < \Phi < 73°,$ and $12° < \phi_2 < 48°,$ and/or $0° \leq \phi_1 \leq 90°, 43° < \Phi < 73°,$ and $72° < \phi_2 < 108°,$ and $0° \leq \phi_1 \leq 90°, 75° < \Phi < 90°,$ and $15° < \phi_2 < 45°,$ and $75° < \phi_2 < 105°.$

18. The cutting tool insert according to claim 1, wherein said layer comprises texture components with Euler angles $0° \leq \phi_1 \leq 90°, 75° < \Phi < 90°,$ and $15° < \phi_2 < 45°,$ and $75° < \phi_2 < 105°,$ and $0° \leq \phi_1 \leq 90°, 75° < \Phi \leq 90°,$ and $45° < \phi_2 < 75°,$ and/or $0° \leq \phi_1 \leq 90°, 75° < \Phi \leq 90°,$ and $105° < \phi_2 \leq 120°.$

19. The cutting tool insert according to claim 1, wherein said layer comprises texture components with Euler angles $0° \leq \phi_1 \leq 90°, 17° < \Phi < 47°,$ and $1° < \phi_2 < 59°,$ and/or $0° \leq \phi_1 \leq 90°, 17° < \Phi < 47°,$ and $61° < \phi_2 < 119°$ and $0° \leq \phi_1 \leq 90°, 0° \leq \Phi < 15°,$ and $0° \leq \phi_2 \leq 120°,$ and $0° \leq \phi_1 \leq 90°, 75° < \Phi < 90°,$ and $15° < \phi_2 < 45°,$ and $75° < \phi_2 < 105°.$

20. The cutting tool insert according to claim 1, wherein said layer comprises texture components with Euler angles $0° \leq \phi_1 \leq 90°, 43° < \Phi < 73°,$ and $12° < \phi_2 < 48°,$ and/or $0° \leq \phi_1 \leq 90°, 43° < \Phi < 73°,$ and $72° < \phi_2 < 108°,$ and $0° \leq \phi_1 \leq 90°, 0° \leq \Phi < 15°,$ and $0° \leq \phi_2 \leq 120°,$ and $0° \leq \phi_1 \leq 90°, 75° < \Phi < 90°,$ and $15° < \phi_2 < 45°,$ and $75° < \phi_2 < 105°.$

21. The cutting tool insert according to claim 1, wherein said layer comprises texture components with Euler angles $0° \leq \phi_1 \leq 90°, 17° < \Phi < 47°,$ and $1° < \phi_2 < 59°,$ and/or $0° \leq \phi_1 \leq 90°, 17° < \Phi < 47°,$ and $61° < \phi_2 < 119°,$ and $0° \leq \phi_1 \leq 90°, 0° \leq \Phi < 15°,$ and $0° \leq \phi_2 \leq 120°,$ and $0° \leq \phi_1 \leq 90°, 75° < \Phi \leq 90°,$ and $45° < \phi_2 < 75°,$ and/or $0° \leq \phi_1 \leq 90°, 75° < \Phi \leq 90°,$ and $105° < \phi_2 \leq 120°.$

22. The cutting tool insert according to claim 1, wherein said layer comprises texture components with Euler angles $0° \leq \phi_1 \leq 90°, 17° < \Phi < 47°,$ and $1° < \phi_2 < 59°,$ and/or $0° \leq \phi_1 \leq 90°, 17° < \Phi < 47°,$ and $61° < \phi_2 < 119°,$ and $0° \leq \phi_1 \leq 90°, 43° < \Phi < 73°,$ and $12° < \phi_2 < 48°,$ and/or $0° \leq \phi_1 \leq 90°, 43° < \Phi < 73°,$ and $72° < \phi_2 < 108°,$ and $0° \leq \phi_1 \leq 90°, 0° \leq \Phi < 15°,$ and $0° \leq \phi_2 \leq 120°.$

23. The cutting tool insert according to claim 1, wherein said layer comprises texture components with Euler angles $0° \leq \phi_1 \leq 90°, 17° < \Phi < 47°,$ and $1° < \phi_2 < 59°,$ and/or $0° \leq \phi_1 \leq 90°, 17° < \Phi < 47°,$ and $61° < \phi_2 < 119°,$ and $0° \leq \phi_1 \leq 90°, 75° < \Phi < 90°,$ and $15° < \phi_2 < 45°,$ and $75° < \phi_2 < 105°,$ and $0° \leq \phi_1 \leq 90°, 43° < \Phi < 73°,$ and $12° < \phi_2 < 48°,$ and/or $0° \leq \phi_1 \leq 90°, 43° < \Phi < 73°,$ and $72° < \phi_2 < 108°.$

24. The cutting tool insert according to claim 1, wherein said layer comprises texture components with Euler angles $0° \leq \phi_1 \leq 90°, 17° < \Phi < 47°,$ and $1° < \phi_2 < 59°,$ and/or $0° \leq \phi_1 \leq 90°, 17° < \Phi < 47°,$ and $61° < \phi_2 < 119°,$ and $0° \leq \phi_1 \leq 90°, 0° \leq \Phi < 15°,$ and $0° \leq \phi_2 \leq 120°,$ and $0° \leq \phi_1 \leq 90°, 43° < \Phi < 73°,$ and $12° < \phi_2 < 48°,$ and/or $0° \leq \phi_2 \leq 90°, 43° < \Phi < 73°,$ and $72° < \phi_2 < 108°,$ and $0° \leq_1 \leq 90°, 75° < \Phi < 90°,$ and $15° < \phi_2 < 45°,$ and $75° < \phi_2 < 105°.$

25. The cutting tool insert according to claim 1, wherein coating comprises of an inner single- and/or multilayers of, e.g. TiN, TiC or Ti(C,O,N) or other $Al_2O_3$ polymorphs, and/or an outer single- and/or multilayers of, e.g. TiN, TiC, Ti(C,O,N) or other $Al_2O_3$ polymorphs to a total thickness 0.5 to 40 μm.

26. A method of making a cutting tool insert comprising a body of cemented carbide, cermet, ceramics or cubic boron nitride based material onto which a hard and wear resistant coating comprising at least one $\alpha$-$Al_2O_3$ layer is deposited by chemical vapour deposition at a temperature between 950° C. and 1050° C. in mixed $H_2$, $CO_2$, CO, $H_2S$, HCl and $AlCl_3$ at a gas pressure between 50 and 150 mbar characterised in periodically varying the $CO_2/CO$ gas flow ratio, upwards and downward, continuously or stepwise between at least two gas flow ratios chosen within the interval $0.3 \leq (CO_2/CO) \leq 6$ and with a difference of at least 0.1, wherein, the time between the starting points for the chosen gas flow ratios is between 1 and 60 minutes, preferably between 2 and 30 minutes;

and wherein, the at least one $\alpha$-$Al_2O_3$ layer has a thickness between 0.5 μm and 30 μm, having an ODF texture index>1, and at least two dominant texture components with 2<ODF density<100 coexisting within the layer.

* * * * *